United States Patent
Roelofs et al.

(10) Patent No.: US 11,211,941 B2
(45) Date of Patent: Dec. 28, 2021

(54) DIGITAL-TO-ANALOG CONVERTER SYSTEM AND METHOD OF OPERATION

(71) Applicant: Luminous Computing, Inc., Menlo Park, CA (US)

(72) Inventors: Katherine Roelofs, Menlo Park, CA (US); Rodolfo Camacho-Aguilera, Menlo Park, CA (US); Matthew Chang, Menlo Park, CA (US); Mitchell A. Nahmias, Menlo Park, CA (US); Michael Gao, Menlo Park, CA (US)

(73) Assignee: Luminous Computing, Inc., Menlo Park, CA (US)

( * ) Notice: Subject to any disclaimer, the term of this patent is extended or adjusted under 35 U.S.C. 154(b) by 0 days.

(21) Appl. No.: 17/202,108

(22) Filed: Mar. 15, 2021

(65) Prior Publication Data
US 2021/0288658 A1   Sep. 16, 2021

Related U.S. Application Data

(60) Provisional application No. 62/989,662, filed on Mar. 14, 2020, provisional application No. 63/013,237, filed on Apr. 21, 2020.

(51) Int. Cl.
*H03M 1/66* (2006.01)
*H03M 1/68* (2006.01)
*H04B 10/516* (2013.01)

(52) U.S. Cl.
CPC .......... *H03M 1/687* (2013.01); *H04B 10/516* (2013.01)

(58) Field of Classification Search
CPC ........ H03M 1/687; H03M 1/66; H04B 10/516
USPC .......................................................... 341/144
See application file for complete search history.

(56) References Cited

U.S. PATENT DOCUMENTS

| | | | | |
|---|---|---|---|---|
| 6,417,965 B1 * | 7/2002 | Ye | ...................... | H04B 10/2942 359/341.4 |
| 7,113,705 B2 * | 9/2006 | Carrick | .................. | H04B 10/00 398/32 |
| 7,333,732 B2 * | 2/2008 | Domagala | .............. | H04B 10/66 398/155 |
| 7,747,176 B2 * | 6/2010 | Domagala | .............. | H04B 10/66 398/202 |
| 8,953,950 B2 | 2/2015 | Nazarathy et al. | | |
| 9,176,361 B2 | 11/2015 | Sartor et al. | | |
| 9,197,471 B1 | 11/2015 | Zanoni et al. | | |
| 9,407,369 B2 | 8/2016 | Yu | | |
| 9,496,964 B2 * | 11/2016 | Sinsky | ................. | H04B 10/673 |
| 10,009,135 B2 | 6/2018 | Tait et al. | | |
| 10,454,580 B2 * | 10/2019 | Gu | ....................... | H04B 10/695 |

(Continued)

OTHER PUBLICATIONS

Dubé-Demers, Raphaël et al. "Low-power DAC-less PAM-4 transmitter using a cascaded microring modulator" vol. 41, No. 22, Optics Letters / Nov. 15, 2016.

(Continued)

*Primary Examiner* — Jean B Jeanglaude
(74) *Attorney, Agent, or Firm* — Jeffrey Schox; Diana Lin

(57) ABSTRACT

A digital-to-analog converter (DAC) system preferably includes one or more optical modulators and can optionally include one or more electronic DAC arrays. A method for digital-to analog conversion preferably includes receiving digital inputs and providing analog optical outputs. The method for digital-to analog conversion is preferably performed using the DAC system.

20 Claims, 17 Drawing Sheets

(56) References Cited

U.S. PATENT DOCUMENTS

| | | | |
|---|---|---|---|
| 10,763,974 B2* | 9/2020 | Bunandar | H04B 10/801 |
| 2005/0117916 A1* | 6/2005 | Kropp | H04B 10/07955 398/202 |
| 2007/0052498 A1 | 3/2007 | Pan et al. | |
| 2012/0197094 A1* | 8/2012 | Zhang | A61B 5/0002 600/301 |
| 2013/0251300 A1 | 9/2013 | Suzuki et al. | |
| 2015/0316794 A1 | 11/2015 | Hayakawa | |
| 2016/0139487 A1 | 5/2016 | Popovic et al. | |
| 2017/0176779 A1 | 6/2017 | Hauenschild et al. | |
| 2017/0222400 A1 | 8/2017 | Taylor | |
| 2018/0205465 A1 | 7/2018 | Tanaka et al. | |
| 2019/0331912 A1 | 10/2019 | Tait et al. | |

OTHER PUBLICATIONS

Hai, Mohammed Shafiqul et al. ,"A Ring-Based 25 Gb/s DAC-Less PAM-4 Modulator" IEEE Journal of Selected Topics in Quantum Electronics, vol. 22, No. 6, Nov./Dec. 2016.

Moazeni, Sajjad "A 40-Gb/s PAM-4 Transmitter Based on a Ring Resonator Optical DACin 45-nm SOI CMOS" IEEE Journal of Solid-State Circuits, vol. 52, No. 12, Dec. 2017.

Nicholl, Gary "PAM-16 Implementation Update" IEEE 802.3 NG100GE Optics Study Group Minneapolis, May 2012.

Park, Anthony H.K. "Comparison of DAC-less PAM4 Modulation in Segmented Ring Resonator and Dual Cascaded Ring Resonator" Department of Electrical Engineering, 978-1-5090-5016-1/17/$31. 00 © 2017 IEEE, 2 pages.

Timurdogan, Erman "An ultralow power athermal silicon modulator" Nature Communications, DOI: 10.1038/ncomms5008, Received Dec. 6, 2013.

Khilo, Anatol , et al., "Photonic ADC: overcoming the bottleneck of electronic jitter", Feb. 13, 2012 / vol. 20, No. 4 / Optic Express.

Konishi, Tsuyoshi , et al., "Five-bit parallel operation of optical quantization and coding for photonics analog-to-digital conversion", Aug. 15, 2011 / vol. 19, No. 17 / Optics Express.

Shile, Wei , et al., "Multimode interference coupler based photonics analog-to-digital conversion scheme", Sep. 1, 2012 / vol. 37, No. 17 / Optics Letters.

Valley, George C., "Photonic analog-to-digital converters", Mar. 5, 2007 / vol. 15, No. 5 / Optics Express.

International Search Report and Written Opinion for application No. PCT/US21/22409 dated Jun. 2, 2021.

* cited by examiner

| electrical signal applied to contact (AU) | | | | modulation response (AU) |
|---|---|---|---|---|
| A | B | C | D | |
| 0 | 0 | 0 | 0 | 0 |
| 0 | 0 | 0 | 1 | 1/15 |
| 0 | 0 | 1 | 0 | 2/15 |
| 0 | 0 | 1 | 1 | 3/15 |
| . | . | . | . | . |
| . | . | . | . | . |
| . | . | . | . | . |
| 1 | 1 | 0 | 1 | 13/15 |
| 1 | 1 | 1 | 0 | 14/15 |
| 1 | 1 | 1 | 1 | 15/15 |

| electrical signal applied to contact (AU) | | modulation response (AU) |
|---|---|---|
| A | B | |
| 0 | 0 | 0 |
| 0 | 1/3 | 1/15 |
| 0 | 2/3 | 2/15 |
| 0 | 1 | 3/15 |
| 1/3 | 0 | 4/15 |
| 1/3 | 1/3 | 5/15 |
| 1/3 | 2/3 | 6/15 |
| 1/3 | 1 | 7/15 |
| . | . | . |
| . | . | . |
| 1 | 1/3 | 13/15 |
| 1 | 2/3 | 14/15 |
| 1 | 1 | 15/15 |

| electrical signal applied to contact (AU) | | modulation response (AU) |
|---|---|---|
| A | B | |
| 0 | 1/7 | 1/63 |
| 0 | 2/7 | 2/63 |
| 0 | 3/7 | 3/63 |
| 0 | 4/7 | 4/63 |
| . | . | . |
| . | . | . |
| . | . | . |
| 1 | 4/7 | 60/63 |
| 1 | 5/7 | 61/63 |
| 1 | 6/7 | 62/63 |
| 1 | 7/7 | 63/63 |

DIGITAL-TO-ANALOG CONVERTER SYSTEM AND METHOD OF OPERATION

CROSS-REFERENCE TO RELATED APPLICATIONS

This application claims the benefit of U.S. Provisional Application Ser. No. 62/989,662, filed on 14 Mar. 2020, and of U.S. Provisional Application Ser. No. 63/013,237, filed on 21 Apr. 2020, each of which is incorporated in its entirety by this reference.

TECHNICAL FIELD

This invention relates generally to the optoelectronic devices field, and more specifically to a new and useful digital-to-analog converter system and method of operation in the optoelectronic devices field.

BACKGROUND

Typical digital-to-analog converters can require significant power and/or structural complexity to operate with adequate precision for many applications. Thus, there is a need in the optoelectronic devices field to create a new and useful digital-to-analog converter system and method of operation.

DESCRIPTION OF THE PREFERRED EMBODIMENTS

The following description of the preferred embodiments of the invention is not intended to limit the invention to these preferred embodiments, but rather to enable any person skilled in the art to make and use this invention.

1. Digital-to-Analog Converter System.

Figure 1A:
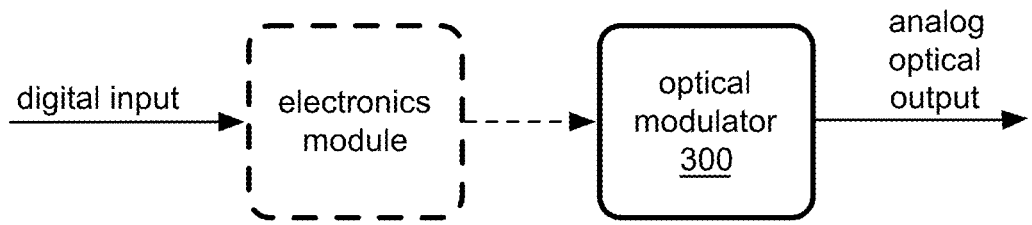
FIGS. 1A-1C are schematic representations of various embodiments of a digital-to-analog converter system.
Figure 1B:
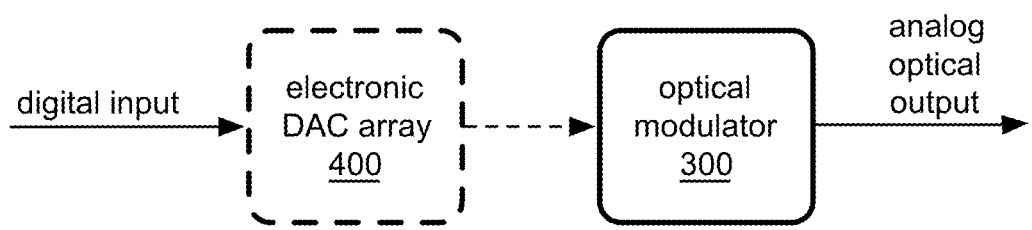
Figure 1C:
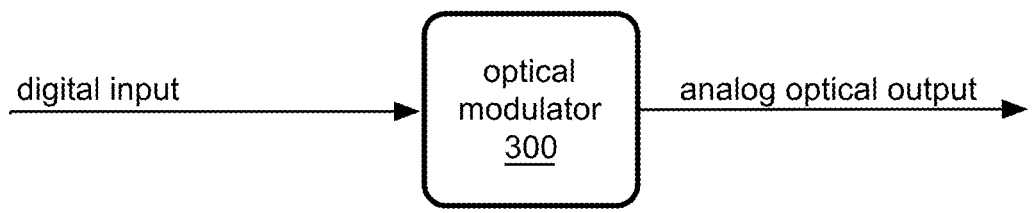

A digital-to-analog converter (DAC) system 10 preferably includes one or more optical modulators 300, and can optionally include one or more electronic DAC arrays 400 and/or any other suitable elements (e.g., as shown in FIGS. 1A-1C). The DAC system preferably functions to convert one or more digital (e.g., serialized binary) electrical signals into analog optical signals.

1.1 Optical Modulator.

The optical modulator 300 preferably functions to modulate the amplitude of an optical signal (or multiple optical signals), such as by attenuating and/or redirecting a portion of the signal intensity. The optical modulator is preferably associated with a maximum modulation magnitude $w_{max}$ (e.g., maximum amplitude modulation factor). However, the optical modulator can additionally or alternatively function to modulate the phase of the optical signal and/or modulate any other suitable aspects thereof.

In embodiments in which $w_{max}$ is a maximum amplitude modulation factor, $w_{max}$ preferably has a value greater than zero (e.g., representing a non-zero maximum amplitude attenuation or redirection factor) and less than or equal to one (e.g., representing a maximum amplitude attenuation or redirection factor bounded by unity). In examples, $w_{max}$ can be substantially equal to 0.25, 0.5, 0.55, 0.6, 0.65, 0.7, 0.75, 0.8, 0.85, 0.9, 0.95, 0.98, 0.99, 1, 0-0.25, 0.25-0.5, 0.4-0.6, 0.55-0.65, 0.6-0.75, 0.7-0.85, 0.8-0.95, 0.9-0.98, 0.95-0.99, 0.99-1, or any other suitable value.

In alternate embodiments, in which $w_{max}$ is a maximum phase shift, $w_{max}$ is preferably equal to (or substantially equal to, such as within 10% of) $\pi$ radians (optionally, modulo $2\pi$, wherein $w_{max}$ mod $2\pi = \pi$), but can alternatively be equal (or substantially equal) to $2\pi$ radians (or wherein $w_{max}$ mod $2\pi = 0$), can be greater than the values described above (e.g., wherein the values described above are achievable within the range of possible phase shifts), or can have any other suitable value. A person of skill in the art will recognize that, for some applications (e.g., wherein a phase shift is used to encode information in a substantially constant light wave, wherein a phase shift is used to control interference with another light wave, etc.), the effect achieved by phase shifts may be unchanged or substantially unchanged by additional phase shifts of integer multiples of $2\pi$ (or, in some cases, integer multiples of $\pi$). Accordingly, in some embodiments, one or more of the phase shifts specified herein can optionally be modified by addition or subtraction of integer multiples of $\pi$ or $2\pi$ (e.g., one or more phase shift values can be considered to be specified modulo $\pi$ or $2\pi$).

Figure 2A:
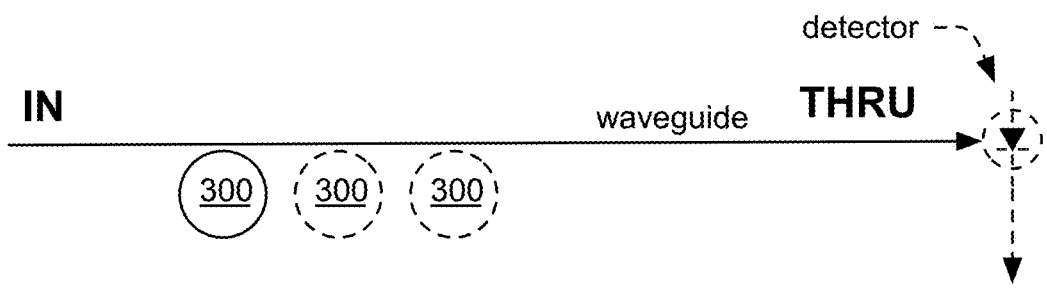
FIGS. 2A-2C are schematic representations of a first, second, and third embodiment, respectively, of a portion of the system.
Figure 2B:
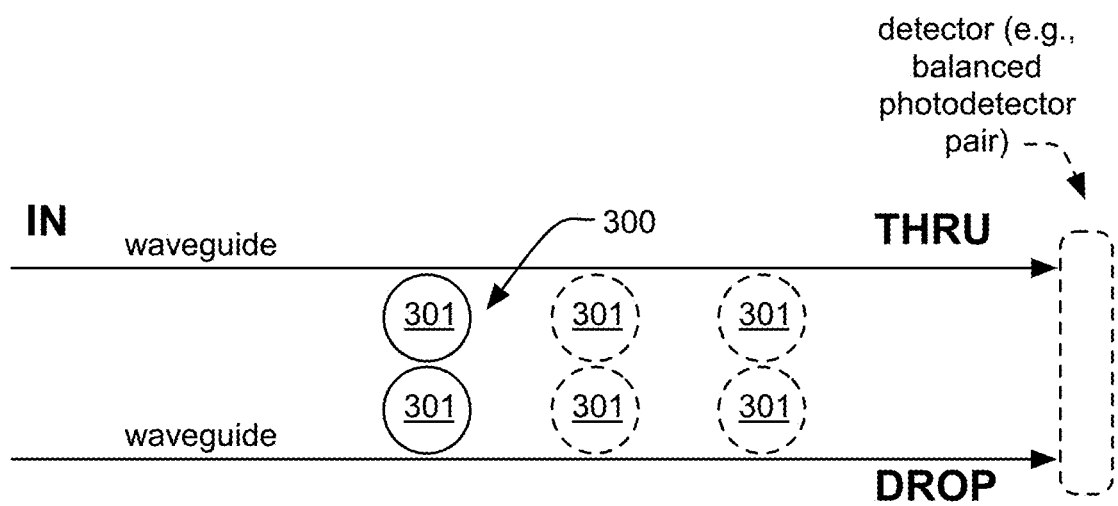
Figure 2C:
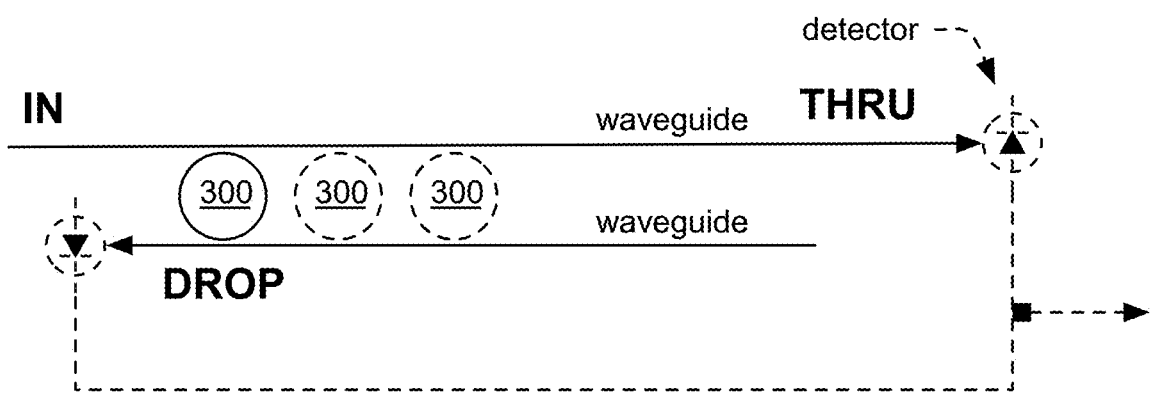

The modulator 300 is preferably optically coupled to one or more optical waveguides (e.g., along which the optical signal(s) propagate). In a first example, the modulator is optically coupled to a single waveguide, and preferably functions to attenuate one or more optical signals propagating along the waveguide (e.g., as shown in FIG. 2A). In a second example, the modulator is coupled to two waveguides, and preferably functions to couple a portion of an optical signal (e.g., propagating along the first waveguide from an IN port to a THRU port) from the first waveguide to the second waveguide (e.g., to a DROP port of the second waveguide), such as shown in FIGS. 2B-2C. In some variations of the second example, in which the system includes multiple such modulators, each modulator (or any other suitable subset of the modulators) is coupled to the same IN and THRU port (e.g., via the first waveguide), but is coupled to a different DROP port (e.g., via a plurality of waveguides, each analogous to the second waveguide described above), each of which can optionally output to a separate detector. However, the modulator can additionally or alternatively be coupled to any other suitable optical elements, and/or can modulate the optical signal in any other suitable manner.

The optical modulator preferably includes one or more microresonators (e.g., microring resonator, microdisk resonator, etc.), but can additionally or alternatively include any other suitable modulators (e.g., photonic crystal defect state modulator, etc.). In some embodiments, the modulator is a multi-pole modulator (e.g., including two or more resonator structures 301, such as multiple microdisks, microrings, etc.), such as shown by way of example in FIG. 2B.

The optical modulator is preferably wavelength-selective (e.g., substantially modulating only a narrow wavelength band, such as substantially modulating only light of a single channel), but can alternatively be a wideband modulator and/or have any other suitable wavelength dependence. In some embodiments, the system 10 includes a plurality of optical modulators 300. For example, the system can include a plurality of wavelength-selective modulators optically coupled to the same waveguide(s), preferably wherein each modulator is configured to modulate optical signals of different wavelengths propagating along the waveguide (e.g., as shown in FIGS. 2A-2C). However, the system 10 can additionally or alternatively include any other suitable modulators, of any suitable types, in any suitable arrangement.

1.1.1 Segments.

The optical modulator 300 preferably includes multiple independently-addressable segments 310, wherein the total number of such segments 310 of the modulator is denoted herein as N. Preferably, each segment 310 can be independently controlled by a separate electrical input signal. The modulator can include 2, 3, 4, 5, 6, 7, 8, 9-16, 16-32, or more than 32 segments 310 (but can alternatively include only a single segment).

Each segment 310 is preferably associated with a modulation response, wherein the modulation response is defined as the amount (e.g., absolute or relative magnitude) of optical modulation for a given electrical input (e.g., per unit of electrical input intensity). For example, the modulation response can be defined as the relative change in optical signal amplitude per unit of electrical voltage or current, or normalized by the maximum electrical input used to control the segment (e.g., in examples in which different segments may be associated with different maximum electrical inputs). Additionally or alternatively, the modulation response can be defined as the relative phase shift of the optical signal for a given electrical input. The difference in modulation (e.g., optical signal amplitude) achieved between a state in which all segments of the modulator are off (e.g., receiving a 0-value electrical input) versus a state in which all the segments are at maximum modulation (e.g., receiving the maximum electrical input, providing the maximum amount of modulation possible, etc.) is preferably equal (or substantially equal) to $w_{max}$. Thus, the modulator can be used to control modulation of the optical signal across a range equal to $w_{max}$.

In some embodiments, each segment 310 of the modulator has a substantially different modulation response. These differences can be achieved by segments of different length (e.g., optical path length), segments having different amounts of p-n junction regions (e.g., optical path length, cross-sectional area, volume such as depletion region volume, etc.), achieved by having segments with different optical, electrical, and/or electro-optical properties, and/or achieved in any other suitable manner. In some embodiments, the modulation response of the segments can define (or substantially define) a geometric series. The geometric series is preferably associated with an integer factor, more preferably wherein the factor is a power of two (e.g., 2, 4, 8, 16, etc.). However, the factor can be any other suitable integer (e.g., 3-15, greater than 15, etc.), can be a non-integer factor (e.g., e, the base of the natural logarithm), and/or the geometric series can define any other suitable factor.

Figure 3A:
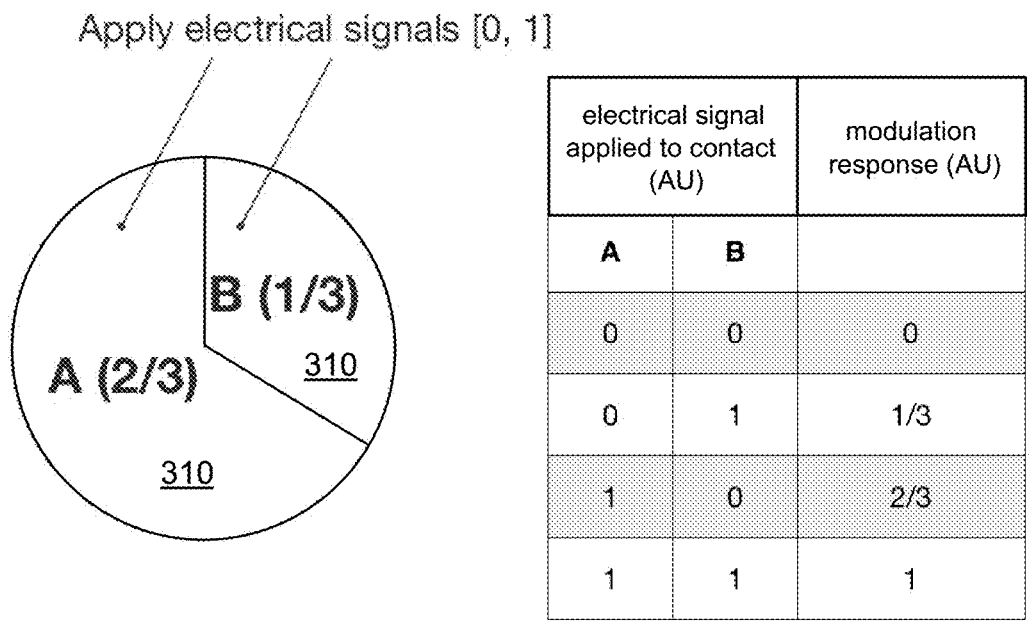
FIGS. 3A-3F are schematic representations of various examples of optical modulators of the system.
Figure 3B:
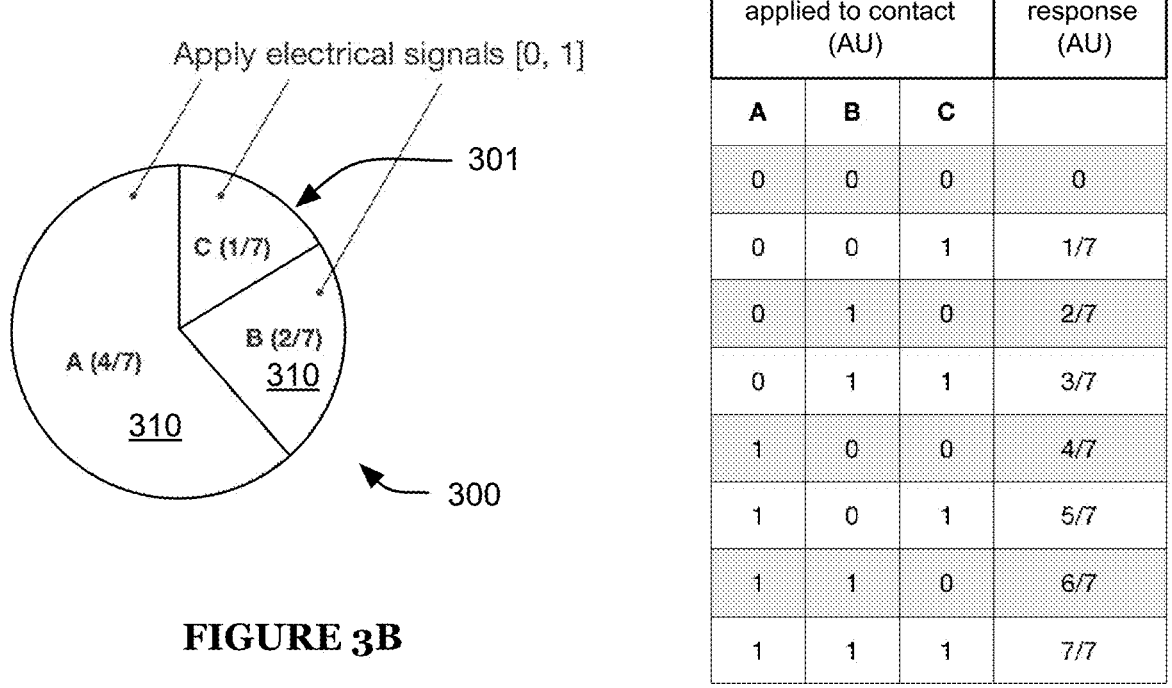
Figure 3C:
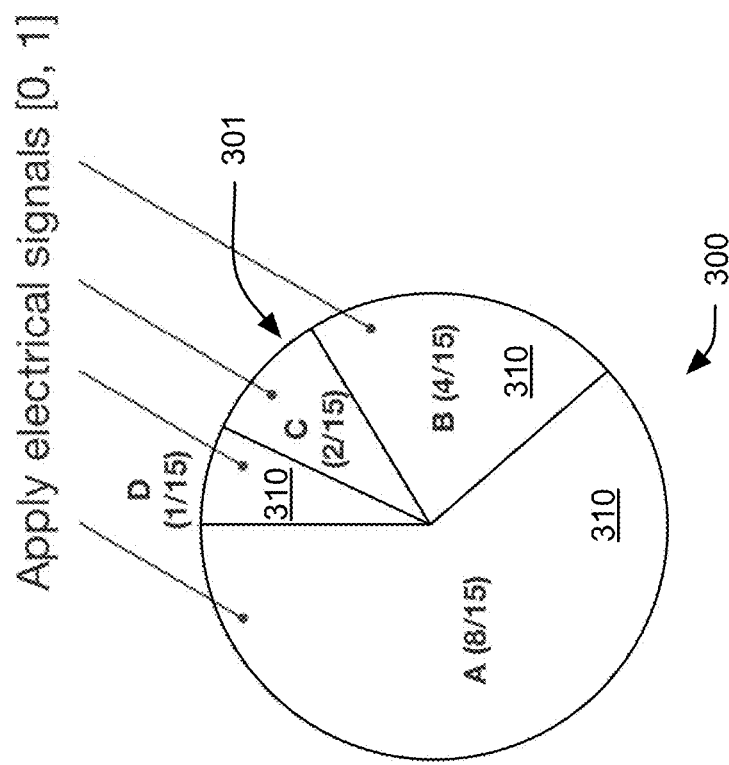
Figure 3D:
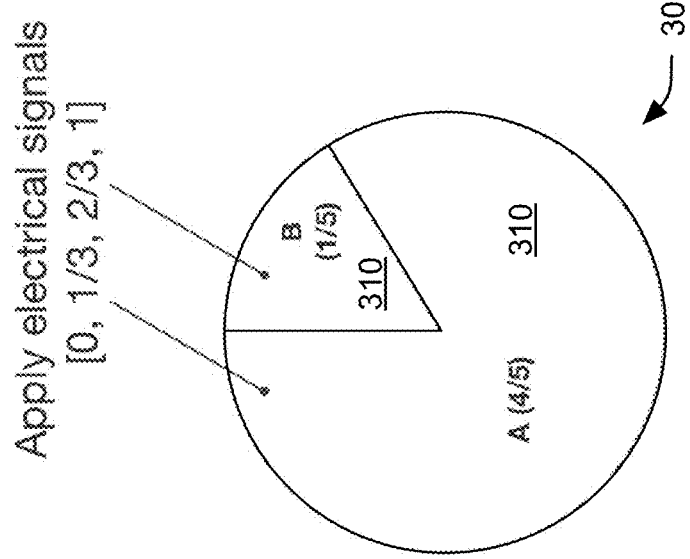
Figure 3E:
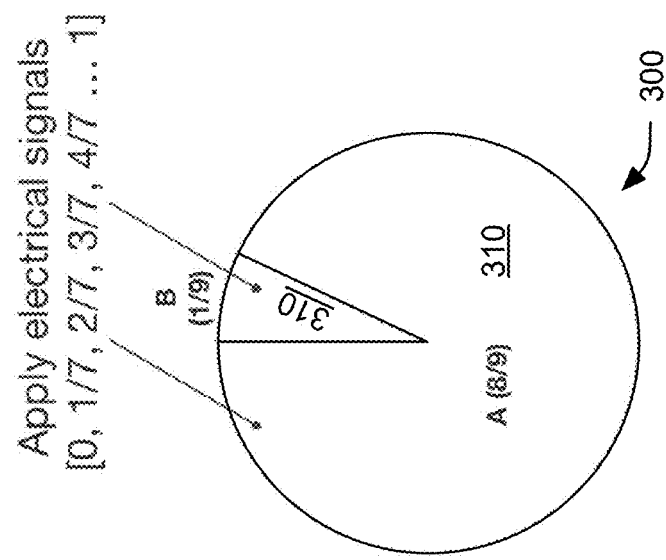

In a first example, the segments can have modulation responses (e.g., and lengths) substantially proportional to successive powers of two (e.g., modulation responses, normalized by $w_{max}$, of: 1/3 & 2/3; 1/7, 2/7, & 4/7; 1/15, 2/15, 4/15, & 8/15; or 1/31, 2/31, 4/31, 8/31, & 16/31; etc.), such as shown in FIGS. 3A-3C. In a second example, the segments can have modulation responses (e.g., and lengths) substantially proportional to successive powers of four (e.g., modulation responses, normalized by $w_{max}$, of: 1/5 & 4/5; 1/21, 4/21, & 16/21; or 1/85, 4/85, 16/85, & 64/85; etc.), such as shown in FIG. 3D. In a third example, the segments can have modulation responses (e.g., and lengths) substantially proportional to successive powers of eight (e.g., modulation responses, normalized by $w_{max}$, of: 1/9 & 8/9; or 1/73, 8/73, & 64/73; etc.), such as shown in FIG. 3E. In a fourth example, the segments can have modulation responses (e.g., and lengths) substantially proportional to successive powers of three (e.g., modulation responses, normalized by $w_{max}$, of: 1/4 & 3/4; 1/13, 3/13, & 9/13; or 1/40, 3/40, 9/40, & 27/40; etc.).

Figure 3F:
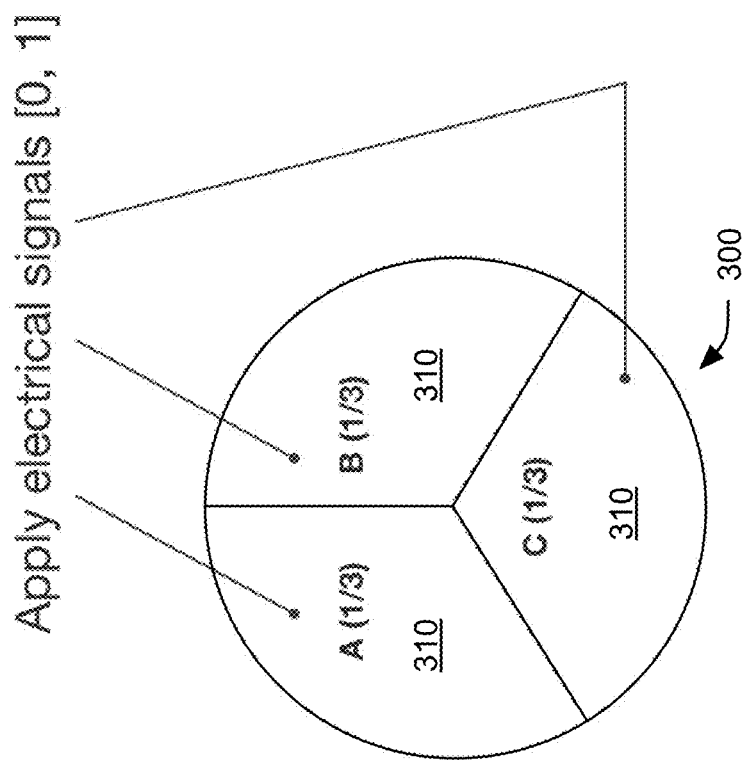

However, the segments of the modulator can additionally or alternatively define any other suitable relationship between the modulation responses. In alternate embodiments, some or all of the segments 310 can have equal or substantially equal modulation responses (e.g., as shown in FIG. 3F). For example, each segment's response can be substantially equal to $w_{max}/N$. However, the segments can additionally or alternatively have any other suitable modulation responses.

Figure 9:
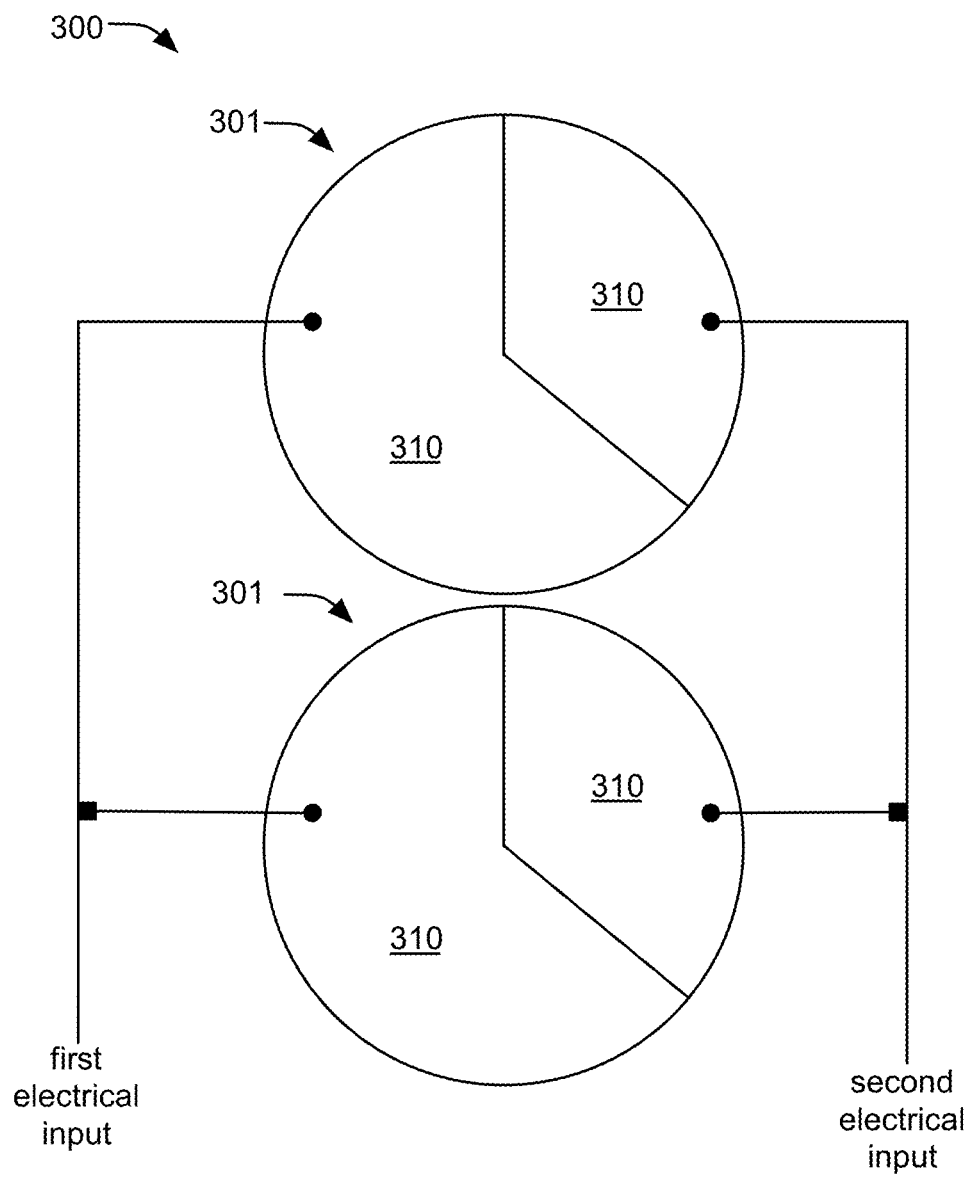
FIG. 9 is a schematic representation of an example of a two-pole optical modulator of the system.

For a multi-pole modulator, each resonator structure 301 preferably has an identical (or substantially identical) segmentation scheme (e.g., wherein each segment 310 of any resonator structure 301 of the multi-pole modulator corresponds to a substantially identical segment, or segment having substantially equal modulation response, in each other resonator structure of the modulator). Corresponding (e.g., substantially identical) segments of the different resonator structures are preferably controlled together, such as by accepting the same electrical control input (e.g., having a shared electrical lead that delivers the input to both segments), such as shown by way of example in FIG. 9; accordingly, each set of corresponding segments that are controlled together can be considered to define a single logical segment. However, the segments can alternatively be independently addressable from segments of the other resonator structures, and/or can be controlled in any other suitable manner.

Figure 4A:
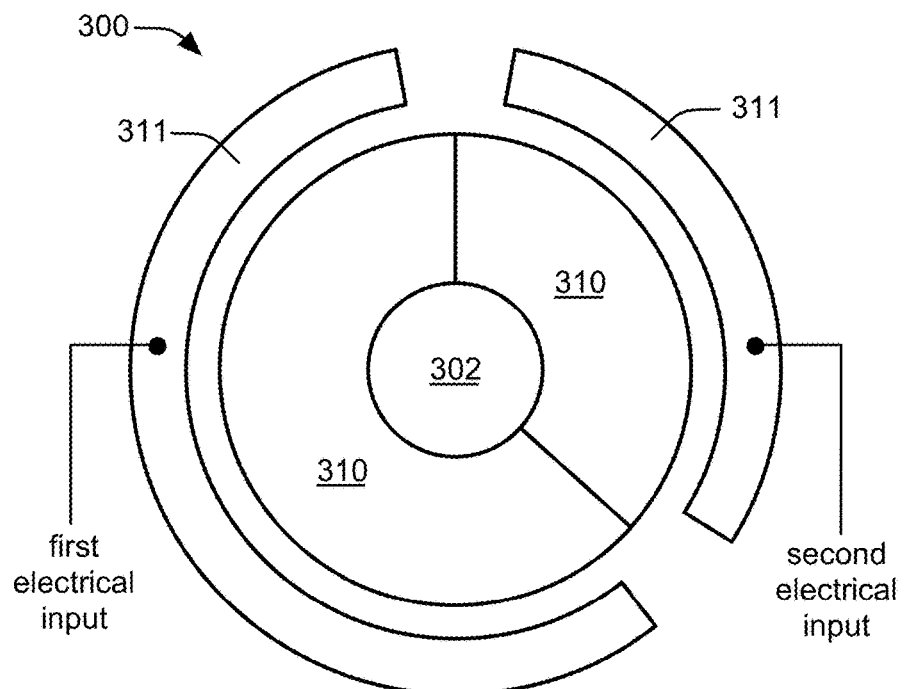
FIGS. 4A-4B are schematic representations of a first variation of an optical modulator and an example of the first variation, respectively.
Figure 4B:
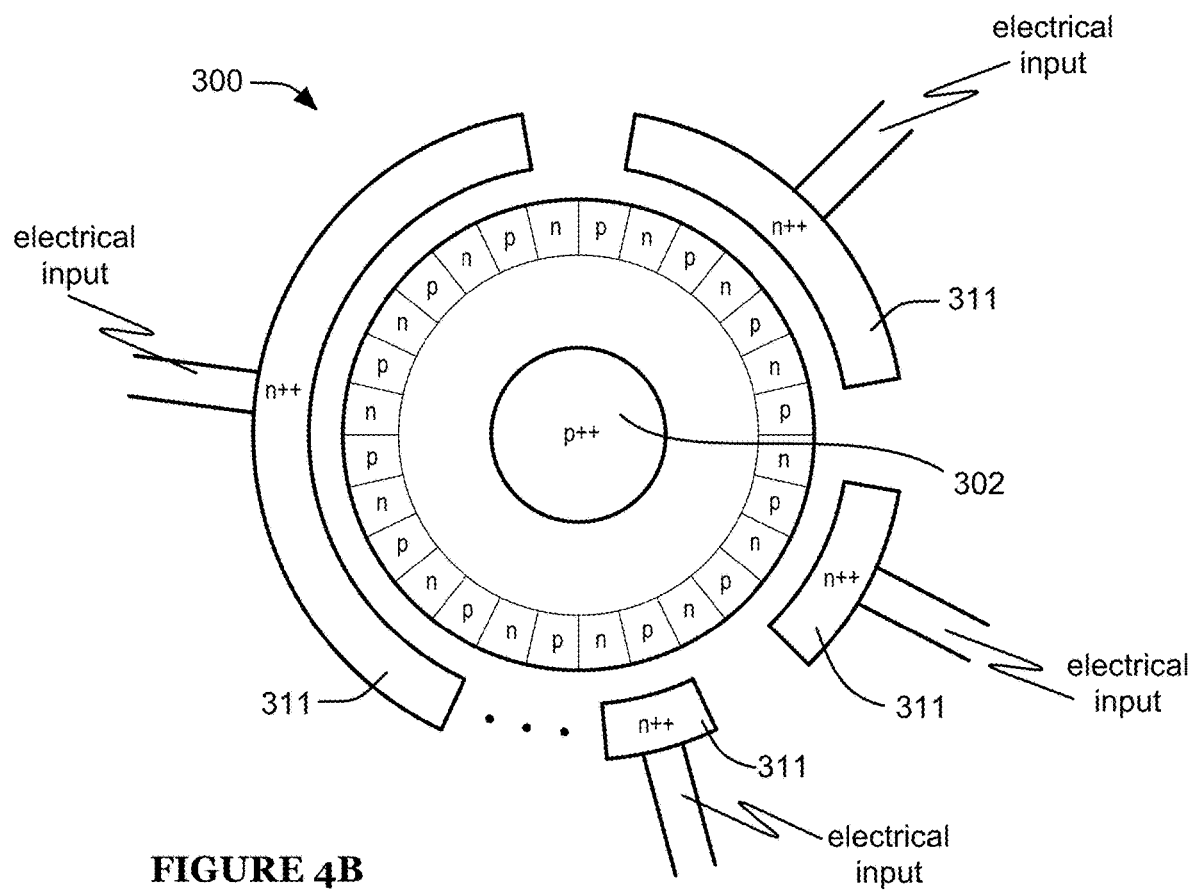

Each segment preferably accepts an electrical input signal (e.g., control signal), such as described above. The electrical input signals provided to each segment are preferably independently controllable from the electrical input signals provided to the other segments of the modulator (except as described above regarding multi-pole modulators). In some examples, the electrical input signal can be a voltage or current between two electrical leads (e.g., connected to two electrical contacts made to the segment, such as made to p- and n-doped regions of the segment, respectively). One of the two contacts can optionally be shared across multiple segments (e.g., all segments of the modulator or a subset thereof). For example, the modulator can include a single shared ground contact 302 and a separate signal contact 311 for each segment. In a first example, the shared ground contact is made at (or near) the resonator center, such as to a highly doped (e.g., degenerately doped) region in the center of a microdisk or microring, and the signal contacts 311 are arranged around the periphery of the microresonator (e.g., as shown in FIGS. 4A-4B). In a second example, the ground contact 302 can be arranged either above or below the resonator, and the signal contacts 311 can oppose the ground across the resonator (e.g., wherein the ground contact is located below the resonator and the signal contacts are located above the resonator, or vice versa).

Figure 5A:
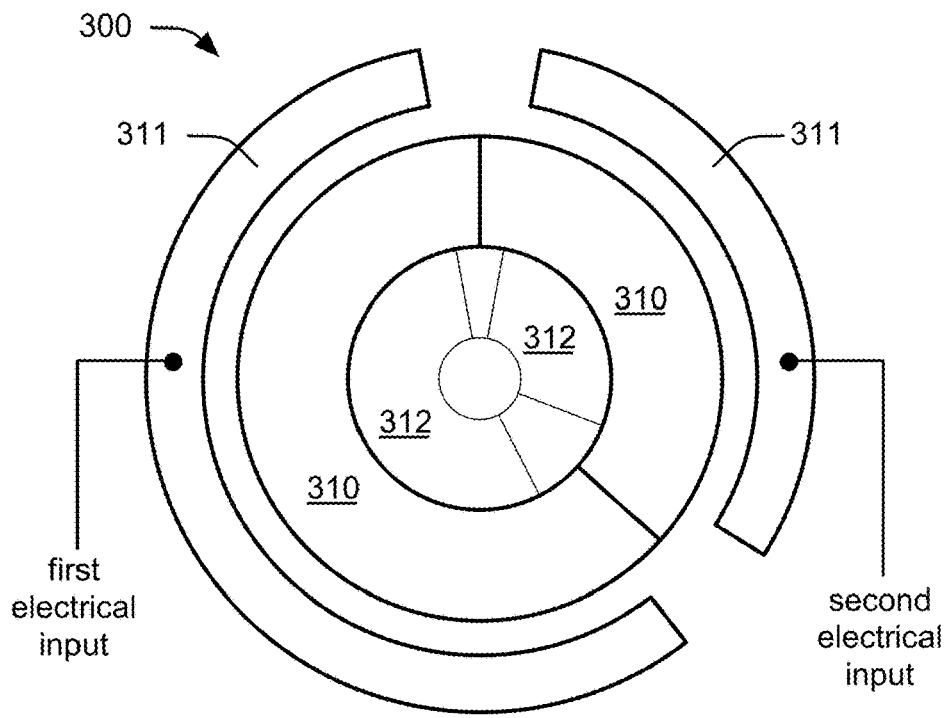
FIGS. 5A-5B are schematic representations of a second variation of an optical modulator and an example of the second variation, respectively.
Figure 5B:
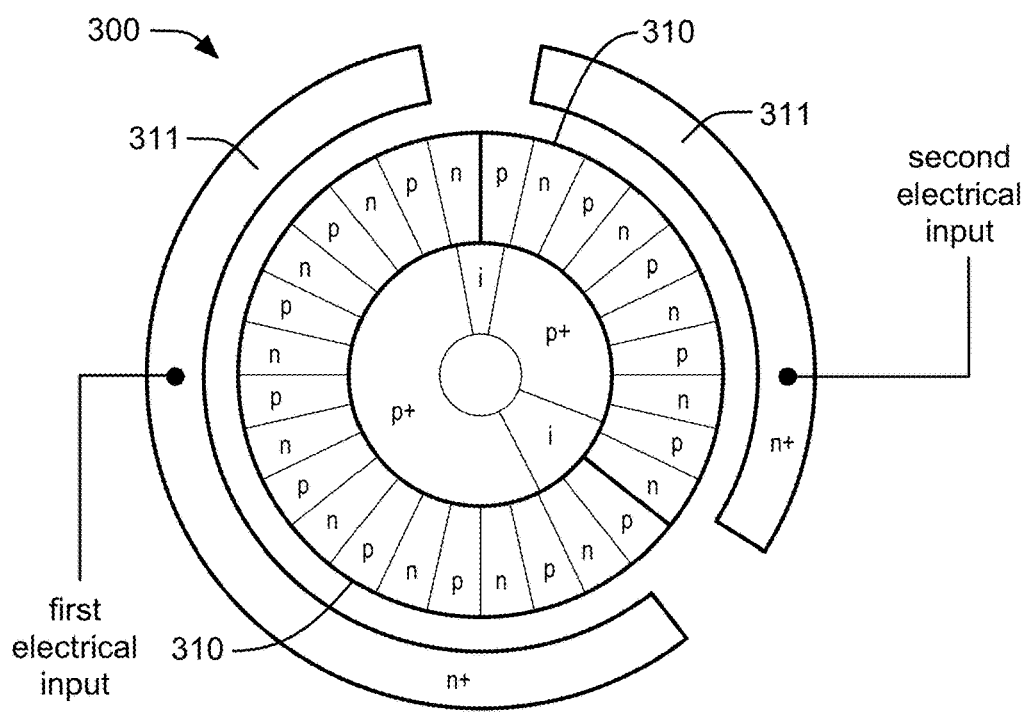
Figure 6:
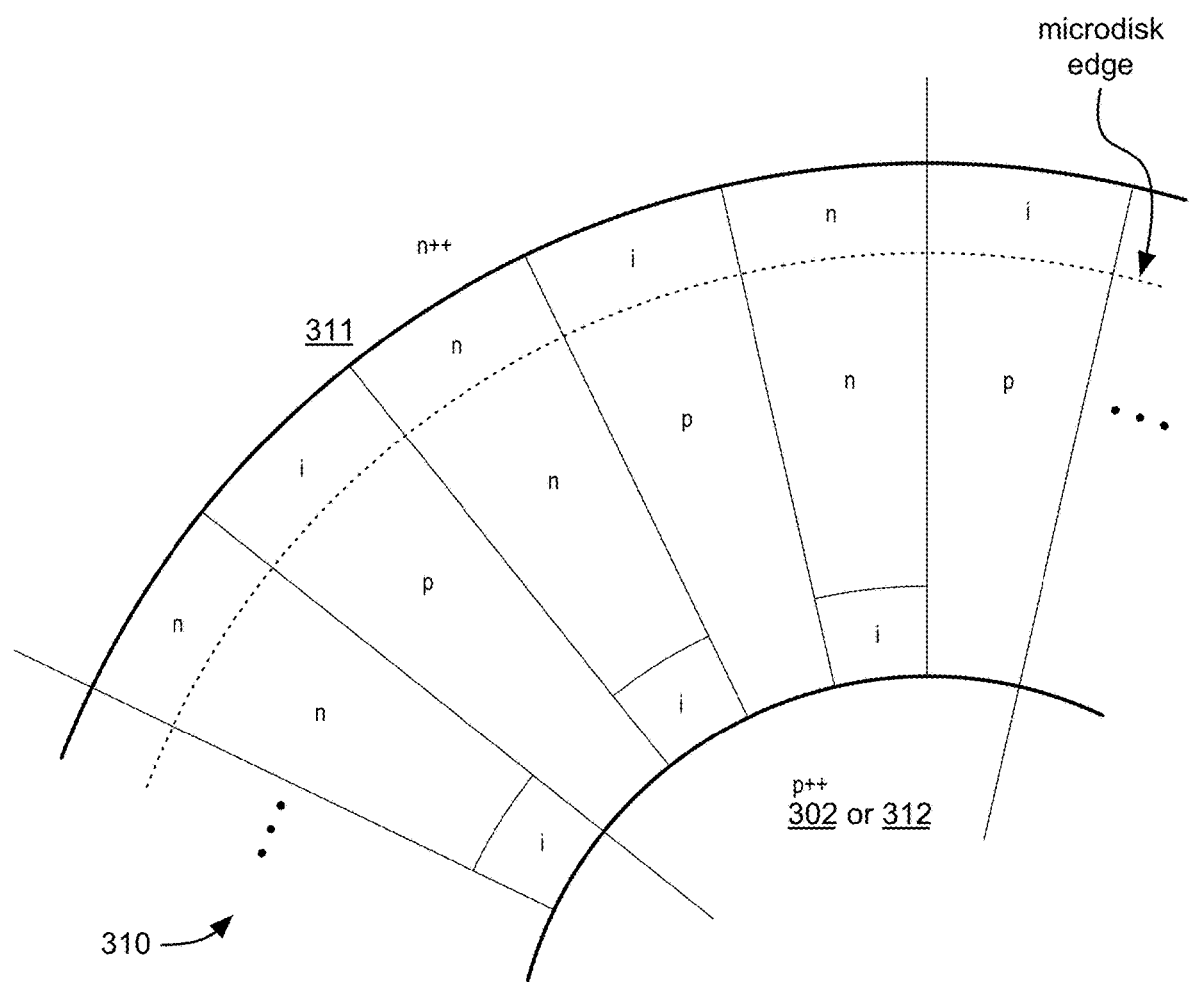
FIG. 6 is a schematic representation of a specific example of a segment of an optical modulator.

In other embodiments, some or all of the segments can have two independent contacts 311, 312 (e.g., as shown in FIGS. 5A-5B). For example, the electrical input signals may be provided by an electrical output for which the voltage of both leads can vary (e.g., a cascode amplifier pair with a varying ground voltage, such as described below regarding the DAC 410). In such embodiments, it can be preferable to utilize two independent contacts such that the voltage of each contact can be varied independently between the different segments. However, the electrical input signals can be delivered to the segments in any other suitable manner.

The electrical input signals (e.g., control signals) can be unary signals, binary signals, higher-base digital signals, analog signals, and/or any other suitable signals. In embodiments in which the signals are unary signals (e.g., thermometer code), the signal preferably drives segments with substantially equal modulation responses (e.g., substantially equal to $w_{max}/N$). In such embodiments, the number of different modulation intensities achievable by the optical modulator is typically equal to N+1, corresponding to N substantially equally spaced steps from 0 to $w_{max}$.

In embodiments in which the electrical input signals are binary signals, the signals preferably drive segments with modulation responses scaling by a power of two (e.g., defining a geometric series with a factor of two, such as described above). In such embodiments, the number of different modulation intensities possible is typically equal to $2^N$, wherein the modulator includes N segments and accepts a binary input of N bits, thereby enabling N bits of optical signal modulation precision. In this embodiment, the least significant bit of the input controls the segment with the smallest modulation response (e.g., the shortest segment), the most significant bit controls the segment with the largest modulation response (e.g., the longest segment), and the intermediate bits control the segments of intermediate modulation response (wherein bits of greater significance control higher modulation response segments than bits of lesser significance).

In embodiments in which the electrical inputs are analog and/or higher-base digital signals (e.g., received from an electronic DAC array 400), the signals preferably drive segments with modulation responses scaling with a power equal to the numerical base of the input signal (e.g., geometric series with a factor of four for a signal with four different levels, geometric series with a factor of eight for a signal with eight different levels, etc.). In such embodiments, the number of different modulation intensity levels possible is typically equal to $b^N$, wherein the modulator includes N segments and accepts an electrical input of N symbols, wherein the symbols define b different output levels (e.g., wherein the symbols represent digits of base-b). Analogous to embodiments in which the electrical input signals are binary signals, the least significant symbol of the input controls the segment with the smallest modulation response (e.g., the shortest segment), the most significant symbol controls the segment with the largest modulation response (e.g., the longest segment), and the intermediate symbols control the segments of intermediate modulation response (wherein symbols of greater significance control higher modulation response segments than symbols of lesser significance).

In some examples, the electrical inputs may include both negative and positive levels. For example, the inputs can range over an odd number of symbols (e.g., 3, 5, 7, 9, etc.), including a symbol representative of zero (e.g., represented by a substantially zero voltage level) and pairs of symbols representative of equal-magnitude positive and negative values (e.g., represented by substantially equal-magnitude positive and negative voltages).

However, the optical modulator 300 can additionally or alternatively accept any other suitable inputs in any suitable manner.

1.1.2 Resonator Structure.

Each resonator structure 301 is preferably a microdisk. However, the microresonator can additionally or alternatively include microrings and/or any other suitable structures. In some embodiments, the microresonator includes alternating p- and n-type regions (and thus defines a plurality of p-n semiconductor junctions), with a single contact to many such regions (of the same doping type) defining a segment 310 (e.g., as shown in FIGS. 4B, 5B, and/or 6). In such embodiments, the alternating p- and n-type regions can define any suitable structures (e.g., interleaved structure, zig-zag structure, vertical junction structure such as a structure in which some or all semiconductor junctions are defined substantially normal to a substrate on which the microresonator is defined and/or to a broad face of the microresonator, and/or combinations thereof, etc.). In a first example, the contact defining the segment can be a contact region of the same doping type (and preferably a higher doping level), adjacent to all the doped regions that it contacts (e.g., wherein each such contact is a highly n-type doped arc, arranged along the microresonator circumference, such as shown in FIGS. 4B and/or 5B). In a second example, the contact can include an individual metal trace to each doped region of the segment.

In alternate embodiments, the resonator structure can include a single p-n junction. In a first example, the p-n junction defines a vertical arrangement, wherein one circular or annular doped region is stacked on top of the other, preferably normal to the substrate on which they are defined. In a second example, the p-n junction defines a lateral arrangement, wherein one annular doped region is arranged radially outward of the other (circular or annular) doped region. In such embodiments, independent contacts to different portions of the circular regions can define independent segments. However, the segments can additionally or alternatively be contacted in any other suitable manner.

In some embodiments (e.g., in which the resonator structures are microdisk resonators), the structures may include a highly-doped region (e.g., n+, n++, p+, p++, etc.) in the center of the resonator, such as shown in FIGS. 4B, 5B, and/or 6. Such a highly-doped region can function to quench higher-order (e.g., undesired) optical modes (e.g., in larger-diameter microdisks, in which such higher-order modes are typically more prevalent). As used herein, "highly-doped" preferably represents a degenerately-doped semiconductor material, such as a silicon material with a carrier concentration greater than $10^{18}/cm^3$, but can additionally or alternatively have a carrier concentration greater than any other suitable threshold value (e.g., $10^{16}/cm^3$, $10^{17}/cm^3$, $10^{19}/cm^3$, $10^{20}/cm^3$, etc.); whereas other doped regions of the structure preferably have doping substantially lower than that of the highly-doped regions (e.g., not degenerately doped, dopant concentration less than the threshold value, etc.).

In some embodiments, the resonator structures include no doping (or lower doping levels, such as n−, n−−, p−, p−−, etc.) near the waveguide(s) to which they are optically coupled (e.g., in regions of the resonator within a threshold distance of the waveguide). In such embodiments, this undoped or lower-doping region is typically not considered to be part of any of the segments 310, and accordingly may not be electrically coupled to any electrical contacts configured to deliver electrical input signals to it. As used herein, "lower-doping" preferably represents a semiconductor material with carrier concentration less than a second threshold value (e.g., $10^{13}/cm^3$, $10^{14}/cm^3$, $10^{15}/cm^3$, $10^{16}/cm^3$, $10^{17}/cm^3$, etc.; lesser than the high doping threshold described above at least by a factor such as $10^2$, $10^3$, $10^4$, $10^5$, $10^6$, etc.), but can additionally or alternatively include semiconductor material having any other suitable doping.

In some embodiments, the resonator structures can include one or more transitional doping regions arranged between (e.g., bridging a gap between) other doped regions. A transitional doping region preferably has an intermediate carrier concentration relative to the other doped regions between which the transitional doping region is arranged. Accordingly, a transitional doping region arranged between a highly-doped region (e.g., n++ or p++) and a more typically-doped region (e.g., n or p) may have n+ or p+ doping. The transitional doping region preferably has the same doping polarity as the adjacent region with higher doping (e.g., the highly-doped region), regardless of the doping polarity of the adjacent region with lower doping (e.g., the more typically-doped region), but can additionally or alternatively have the same doping polarity as the adjacent region with lower doping, can have the opposite doping polarity, and/or can have any other suitable doping polarity. In some examples, such transitional doping regions may be arranged in portions of the resonator structure with lower thickness (e.g., out-of-plane thickness, such as thickness measured normal to the substrate on which the resonator structure is fabricated and/or supported). In such examples, doping of these regions may provide sufficient electrical conductance between the other elements of the resonator structure (e.g., whereas lower doping in these lower thickness regions could result in insufficient conductance through such regions). However, the transitional doping regions can additionally or alternatively be arranged in any other suitable locations.

In some examples, the resonator structures can include one or more such transitional doping regions arranged between the segments 310 and one or more electrical input regions (e.g., the ground contact(s) 302, the signal contacts 311, etc.). In a specific example, a resonator structure, which includes n++ doped signal contacts 311, a p++ doped ground contact 302, and one or more segments 310 including regions of alternating n and p doping (arranged in between the ground contact and the signal contacts, such as shown by way of example in FIG. 4B), can include an n+ doped transitional region between the segments and the signal contacts, and/or can include a p+ doped transitional region between the segments and the ground contact.

However, the resonator structures 301 can additionally or alternatively have any other suitable structure (e.g., doping structure, contact structure, etc), and/or can include any other suitable elements in any suitable arrangement.

1.2 Electronic DAC Array.

The system 10 can optionally include an electronic DAC array 400. The array 400 can function to provide electrical input signals to the optical modulator 300 (e.g., in embodiments in which the segment modulation responses of the optical modulator define a geometric series with factor greater than two).

The array 400 is preferably implemented as part of an integrated circuit (e.g., on a substrate such as a wafer or portion thereof, such as a die of the wafer). In some embodiments, the array 400 is implemented on the same die as the optical modulator 300. In other embodiments, the array 400 is otherwise mechanically coupled to the optical modulator 300 (e.g., an electronic substrate including the electronic DAC array 400 is bonded to a photonics substrate including the optical modulator 300), such as by wafer-to-wafer bonding (e.g., bonding between an electronics wafer that includes the electronic DAC array 400 and a photonics wafer that includes the optical modulator 300), die-to-wafer bonding (e.g., bonding between an electronic die that includes the electronic DAC array 400 and a photonic wafer that includes the optical modulator 300, bonding between an electronic wafer that includes the electronic DAC array 400 and a photonic die that includes the optical modulator 300, etc.), and/or any other suitable bonding technique(s). In examples, one or more such bonding techniques can optionally include bump bonding (e.g., with under-bump metallization), hybrid bonding, and/or flip chip bonding. However, the electronic DAC array 400 can additionally or alternatively be coupled to the optical modulator 300 in any other suitable manner.

1.2.1 Digital-to-Analog Converters.

The electronic DAC array 400 preferably includes a plurality of digital-to-analog converters (DACs) 410. Each DAC 410 is preferably electrically coupled to (e.g., configured to provide electric input signals to) a different segment 310 of the optical modulator. The DACs of the array are preferably associated with a significance, wherein the modulation response of the segment to which a DAC provides an electrical input signal defines the significance of that DAC (e.g., wherein the DAC with the highest significance provides an electrical input signal to the segment with the largest modulation response, the DAC with the lowest significance provides an electrical input signal to the segment with the smallest modulation response, and so on). The DAC preferably provides a multi-level signal (e.g., defining a plurality of different symbols, such as 4, 8, 3-16, or any other suitable number of symbols, preferably represented by different levels of an electrical characteristic such as voltage or current), but can alternatively provide a binary signal and/or any other suitable signal. For example, each DAC can provide an output including four or eight different equally spaced levels (e.g., voltage levels).

In some examples, the DAC outputs may include both negative and positive levels. For example, a DAC can provide an output with an odd number of symbols (e.g., 3, 5, 7, 9, etc.), including a symbol representative of zero (e.g., represented by a substantially zero voltage level) and pairs of symbols representative of equal-magnitude positive and negative values (e.g., represented by substantially equal-magnitude positive and negative voltages).

In some examples, the outputs of the DAC array can include signals associated with different numerical bases. For example, each DAC of the array may be associated with a particular numerical base (e.g., each DAC associated with a different base, some but not all DACs associated with the same base, etc.), and the modulation response of the segment controlled by a DAC (e.g., receiving a control signal from the DAC) is preferably scaled according to the output configuration of that particular DAC, more preferably such that the maximum modulation achievable by a particular segment in response to a normal DAC output is less than the minimum non-zero modulation achievable by the segment of next-higher modulation response (e.g., wherein the ratio of modulation responses between two segments of adjacent significance is substantially equal to the number of levels received by the higher modulation response segment). In a specific example, in which a lower-response segment (having a modulation response a) receives a base-m input signal and the next higher-response segment (having a modulation response b) receives a base-n input signal (wherein n and m may be the same or different), the modulation responses of these segments can substantially satisfy the equation b=an(m+1)/m. However, the segment modulation responses can additionally or alternatively define any other suitable ratios.

However, the DACs can additionally or alternatively provide any other suitable signals. A person of skill in the art will recognize that, just as the DACs can provide any of the signals described above (and/or any other suitable signals), the input signals received by the system can analogously be represented in any of the forms described above regarding the DAC output signals (e.g., in embodiments in which the system does not include a DAC array) and/or in any other suitable forms.

All DACs 410 of the array 400 are preferably substantially equivalent (e.g., having substantially equal precision, outputting the same number of different symbols, outputting signals having equivalent electrical characteristics such as voltage or current, etc.). However, some or all of the DACs can alternatively be different from one another (e.g., having different output characteristics, etc.). In some embodiments, some DAC electrical outputs may exceed a threshold voltage associated with the circuit in which the DAC is implemented. For example, the maximum output voltage of the DAC may exceed $V_{DD}$ (e.g., be substantially equal to $2V_{DD}$). However, the DACs may additionally or alternatively have outputs of any other suitable magnitudes.

Figure 7:
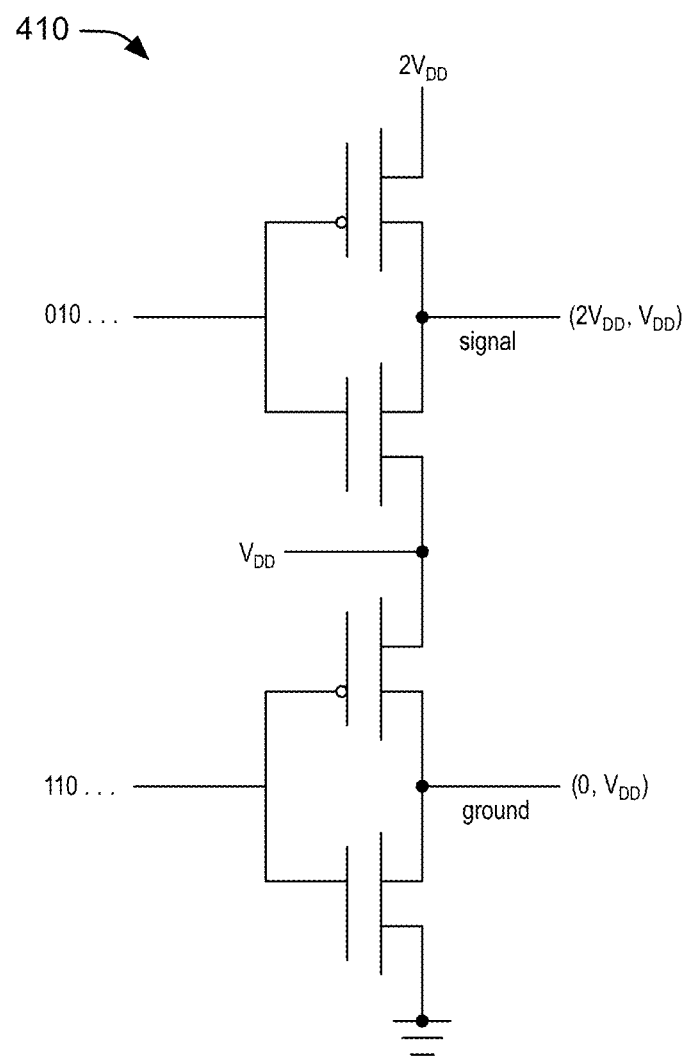
FIG. 7 is a circuit diagram of an example of an electronic DAC of the system.

In a first embodiment, the DAC includes a cascode inverter pair (e.g., as shown in FIG. 7). In this embodiment, both electrical lines of the output will typically vary in voltage. For example, the first line voltage $V_1$ may vary between 0 and a reference voltage $V_{ref}$ (e.g., wherein $V_{ref}=V_{DD}$), and the second line voltage $V_2$ may vary between $V_{ref}$ and $2V_{ref}$, wherein the value of the output is equal to $V_2-V_1$ (which can vary between 0 and $2V_{ref}$). Accordingly, such a DAC is preferably coupled to a segment having two independent contacts (e.g., as described above regarding the independent contacts 311, 312), rather than one that shares a ground contact 302 with other segments, so that the voltage of both contacts can be varied independently for each segment. In a second embodiment, the DAC includes a charge pump (e.g., to enable application of a larger voltage than the DC power supply available in the digital integrated circuit) and/or level shifter (e.g., to set the value of each DAC output). However, the electronic DAC array can additionally or alternatively include any other suitable DACs.

Although referred to herein as a digital-to-analog converter, a person of skill in the art will understand that the DACs can additionally or alternatively convert electrical signals from a lower-base digital signal (e.g., binary) to a higher-base digital signal (e.g., base 4, base 8, base 16, etc.), such as a single-digit output or a parallel output (e.g., wherein a representation of each digit is provided on a separate electrical path, preferably being provided concurrently with the representations of all other digits of the signal), but additionally or alternatively as a serial output, a parallel-serial output, and/or any other suitable form of output.

1.2.2 Deserializer.

The electronic DAC array 400 can optionally include a deserializer 420. The deserializer can function to split serialized data into a plurality of parallel outputs between the DACs of the array. For example, the deserializer can convert a serial digital signal (e.g., provided on a single electrical line) into a plurality of parallel digital signals (e.g., wherein each signal of the plurality is provided concurrently to a different DAC of the array, preferably via one or more separate electrical lines for each DAC). The deserializer is preferably an electronic deserializer, but can additionally or alternatively include any other suitable type of deserializer.

Figure 8A:
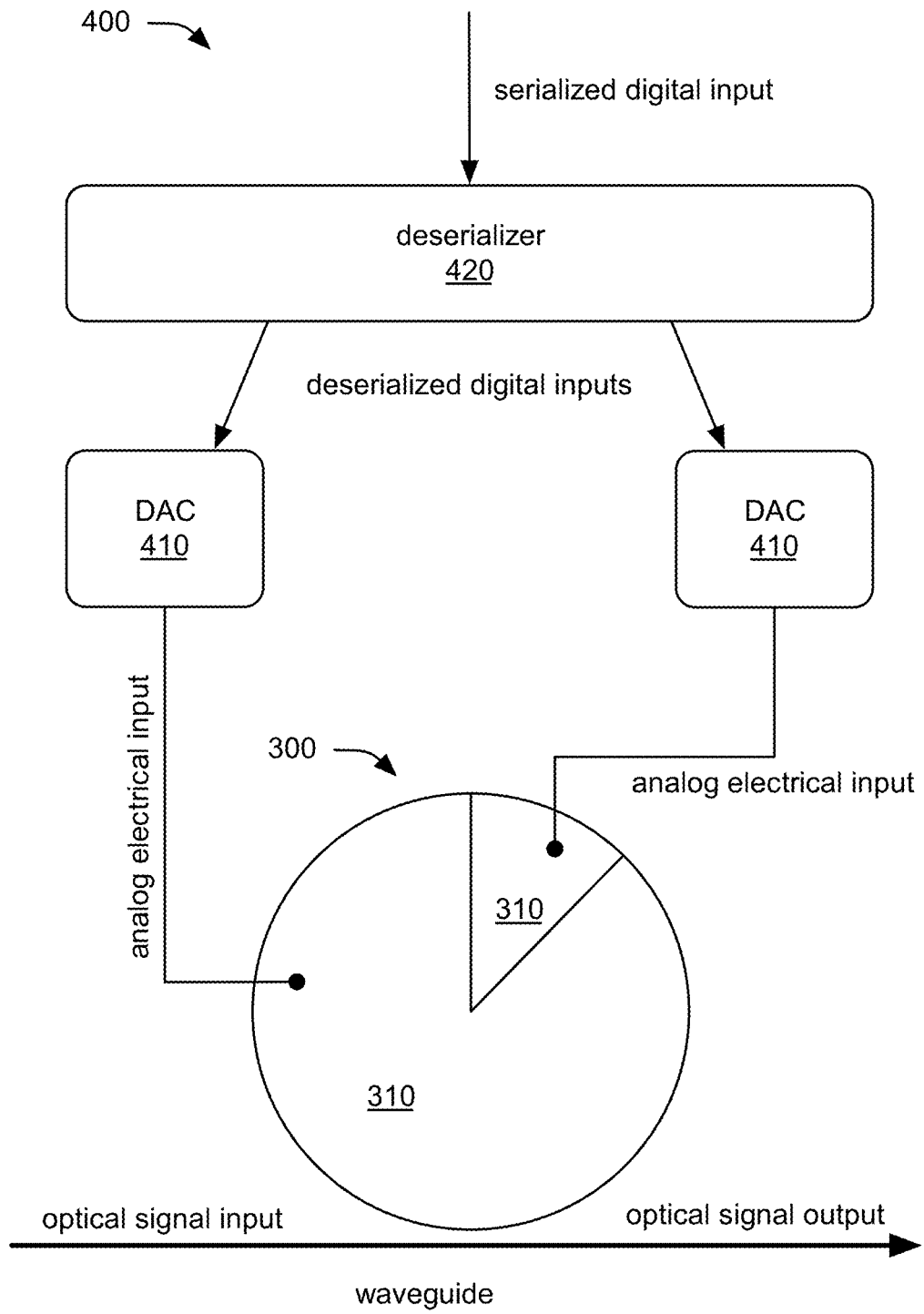
FIG. 8A is a schematic representation of a first example of the system.
Figure 8B:
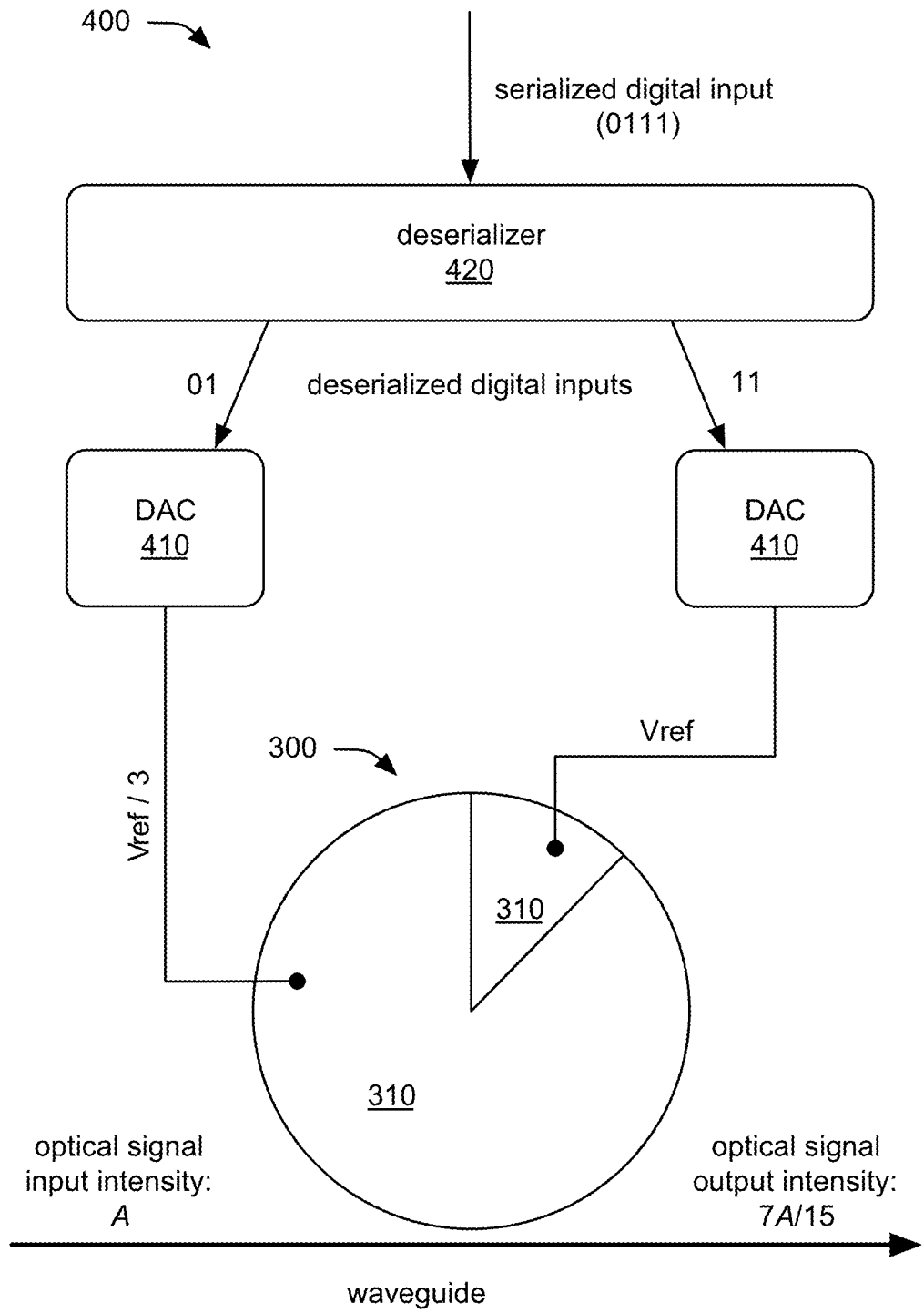
FIG. 8B is a specific example of signals in the example of FIG. 8A.
Figure 8C:
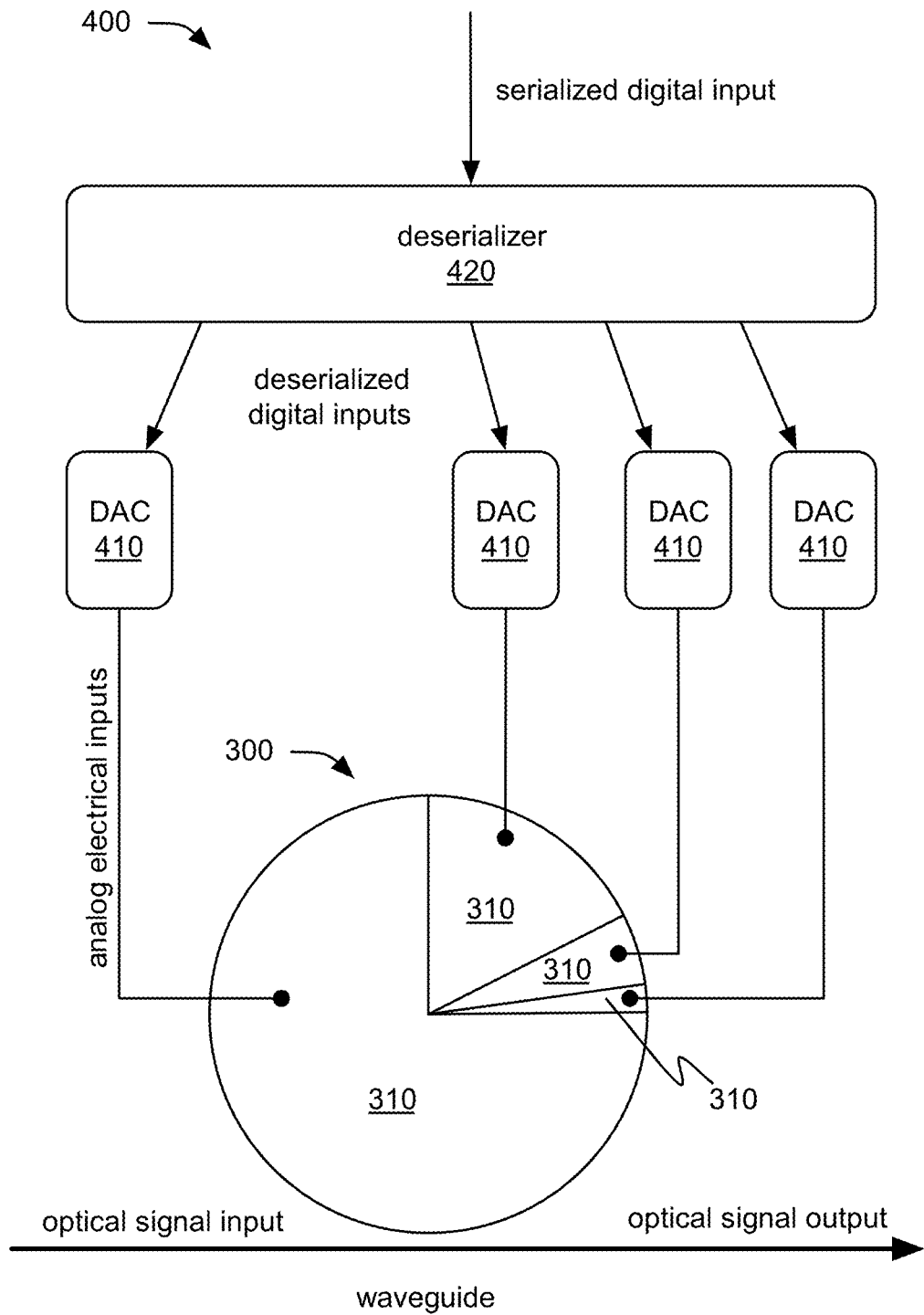
FIG. 8C is a schematic representation of a second example of the system.

In embodiments including a deserializer, the number of bits provided to the DAC is preferably equal to the DAC precision (e.g., wherein a DAC having 4 output levels, and thus a 2-bit precision, would receive 2 bits of input data), but can alternatively be lesser than the DAC precision (e.g., wherein some precision of the DAC goes unused due to the use of a lower-precision digital input signal) or greater than the DAC precision (e.g., wherein some precision of the digital input signal is lost due to the lower precision of the DAC). The most significant bits of the data are preferably provided to the highest significance DAC, the least significant bits of the data are preferably provided to the lowest significance DAC, and so on. In a first example, in which the electronic DAC array includes two DACs, each having two bits of precision, a 4-bit input signal can be deserialized to provide two bits of data to each DAC (e.g., as shown in FIGS. 8A-8B). In a second example, in which the electronic DAC array includes four DACs, each having two bits of precision, an 8-bit input signal can be deserialized to provide two bits of data to each DAC (e.g., as shown in FIG. 8C).

However, the electronic DAC array 400 can additionally or alternatively include any other suitable elements in any suitable arrangement.

Figure 8D:
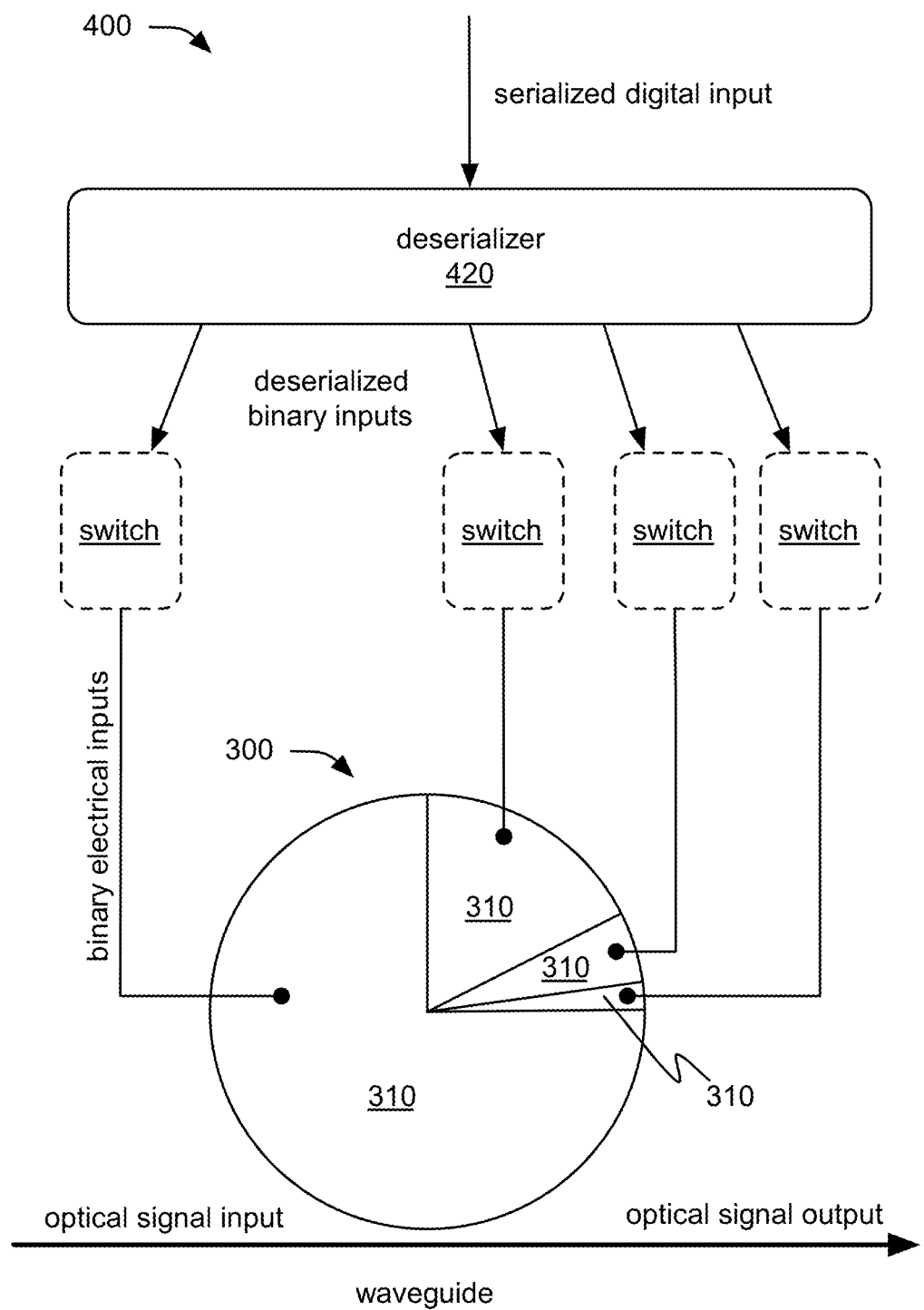
FIG. 8D is a schematic representation of a third example of the system.

In alternate embodiments (e.g., in which the modulator 300 accepts a unary or binary signal), the system 10 may not include an electronic DAC array 400. In a first example, in which the modulator accepts a unary signal, the system can optionally include a unary converter, which can function to convert a digital signal (e.g., digital electrical signal) into a unary control signal, preferably a deserialized unary signal, that is preferably provided to the segments of the modulator (e.g., each unary digit provided to a different segment, such as described above). In a second example, in which the modulator accepts a binary signal, the system can optionally include a deserializer (e.g., similar to or the same as the deserializer 420 described above), which can function to deserialize a serial binary signal into a plurality of parallel binary signals, and preferably outputs the parallel signals to the segments of the modulator (e.g., wherein the most significant bit of the signal is preferably provided to the segment with the largest modulation response, the least significant bit of the signal is preferably provided to the segment with the smallest modulation response, and so on, such as shown by way of example in FIG. 8D). In one specific example, each deserialized bit (or unit, in the unary control signal example) can be used directly to drive a respective segment of the modulator, whereas in a second specific example, each deserialized bit (or unit) can be used to control a respective switch (e.g., transistor), wherein the output of each switch is used to drive a respective segment of the modulator. However, the system 10 can additionally or alternatively include any other suitable elements configured to convert and/or deliver electrical inputs to the modulator 300, and/or the system 10 can additionally or alternatively include any other suitable elements in any suitable arrangement.

1.3 Material Platforms.

The system can include (e.g., be made of) any suitable materials. The system (and/or elements thereof, such as some or all of the photonic elements) can be implemented on one or more material platforms, such as photonic integrated circuit platforms (e.g., silicon photonics platforms, monolithically integrated photonics and electronics platforms, other photonic platforms, etc.), microelectronic platforms, and/or any other suitable material platforms. In a first embodiment, the system is implemented as a monolithic platform (e.g., including both photonic elements and electronic elements on a single chip). In a second embodiment, the system is implemented as a heterogeneously integrated platform, such as a platform including two or more chips (e.g., with electronic and/or photonic interfaces between the chips). For example, the heterogeneously integrated platform can include a photonics chip including photonic elements (e.g., and relatively few or no electronic elements, relatively few or no electronic elements with fabrication dimensions below a threshold, etc.; alternatively, including significant electronic elements) and an electronics chip including electronic elements (e.g., and few or no photonic elements; alternatively, including significant photonic elements). In some examples (e.g., of the second embodiment), the system is fabricated via co-integration (e.g., between electronics and photonics), such as wherein different elements of the system can be joined together (e.g., for wafer-to-wafer, die-to-wafer, and/or die-to-die bonding) using one or more packaging technologies such as flip chip bonding, wafer bonding (e.g., direct bond interconnect, hybrid bonding, etc.), through-oxide vias (TOVs), through-silicon vias (TSVs), metal bonding (e.g., eutectic bonding), adhesive bonding, and/or any other suitable bonding interfaces.

In one embodiment, the system can include elements implemented in a silicon photonics platform (e.g., implemented by one or more foundries such as APSUNY, IME, IMEC, GlobalFoundries, TSMC, etc.), which can include silicon, silicon doping, silicon oxides, passive silicon components (e.g., waveguides, filters, etc.), and/or germanium-based elements (e.g., detectors, filters and/or modulators, such as EAMs, etc.). Additionally or alternatively, the system can include elements implemented in one or more III-V platforms (e.g., JePPiX consortium SMART Photonics and/or HHI platforms, Infinera, AIM Photonics, etc.), which can include materials such as indium compounds, phosphide compounds, gallium compounds, arsenide compounds, and/or any other suitable III-V semiconductors (e.g., InGaAsP alloys, such as InP or GaAs substrate with InGaAsP features). In an example of this embodiment, the emitters (e.g., laser array) are fabricated in the III-V semiconductor platform, the multiplexer is fabricated in either the III-V semiconductor platform or the silicon photonics platform, and substantially all other photonic elements of the system (e.g., except some or all waveguides associated with the emitters) are fabricated in the silicon photonics platform. In some examples, the elements can be co-integrated with elements implemented in an electronics platform (e.g., integrated such as described above regarding packaging technologies). In some such examples, one or more electronic elements (e.g., transistors) are fabricated in the photonics platform rather than the electronics platform (e.g., thereby enabling and/or facilitating use of high-voltage elements that exceed the voltage limits of the electronics platform). For example, in a system in which elements from a 7 nm electronics platform (e.g., with a 0.6-0.8V limit, such as a 0.65, 0.7, or 0.75 V limit) are coupled with elements from a silicon photonics platform, the silicon photonics platform elements can include transistors (e.g., configured to amplify signals received from the electronics platform elements) operating with voltages in excess of the electronics platform limit.

The system can additionally or alternatively include elements implemented in a monolithically integrated photonics and electronics platform (e.g., platform typically used for microelectronics) such as a monolithically integrated silicon photonics and electronics platform, preferably wherein some or all photonic and electronic elements of the system are implemented monolithically (e.g., collocated in the same integrated circuit). Additionally or alternatively, the systems can include elements implemented in a co-integrated electronic and photonic platform, such as one that includes front-end-of-line (FEOL) modifications to a standard microelectronic fabrication process and/or back-end-of-line (BEOL) modifications for the fabrication of integrated photonic components (e.g., with low capacitance links to the electronics).

The system can additionally or alternatively include elements implemented in a hybrid silicon/III-V photonics platform, such as wherein silicon photonics elements and III-V photonics elements (e.g., optical amplifiers, laser sources, etc.) are implemented monolithically (e.g., collocated in the same integrated circuit). For example, a III-V semiconductor substrate (e.g., InP) can support both the silicon photonics elements and III-V photonics elements.

The system can additionally or alternatively include elements implemented in a silicon nitride photonics platform (e.g., JePPiX consortium TriPLeX platform), such as including waveguides defined by silicon nitride within a silicon oxide.

The system can additionally or alternatively include elements implemented in a silicon-graphene photonics platform, such as wherein one or more photonic elements (e.g., active elements, such as detectors, filters, modulators, etc.) are implemented using graphene, other graphitic materials, and/or other 2-D materials.

The system can additionally or alternatively include elements implemented in a lithium niobate photonics platform, which can include one or more photonic elements implemented using lithium niobate, such as thin-film lithium niobate.

In a specific example, the system includes elements fabricated such as described in U.S. Pat. No. 8,027,587, issued 27 Sep. 2011 and titled "Integrated Optic Vector-Matrix Multiplier", which is hereby incorporated in its entirety by this reference (e.g., elements fabricated as described regarding fabrication on silicon-on-insulator wafers).

A person of skill in the art will recognize that the elements described herein using the term "waveguide" can additionally or alternatively include any other suitable optical paths and/or elements associated with optical paths (including, without limitation, free-space paths and/or paths including free-space segments).

However, the system can additionally or alternatively be implemented in any other suitable material platform, and can additionally or alternatively include any other suitable materials.

2. Method.

Figure 10:
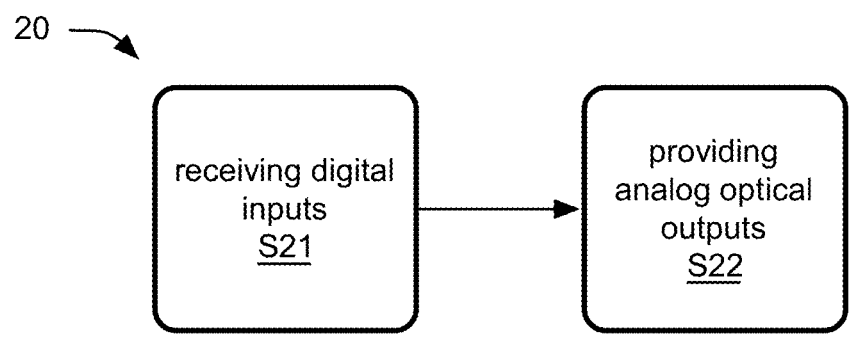
FIG. 10 is a schematic representation of an embodiment of a method for digital-to-analog conversion.

A method 20 for digital-to-analog conversion is preferably implemented using the DAC system 10 described above, but can additionally or alternatively be implemented using any other suitable systems. The method preferably functions to convert a digital signal (e.g., digital electrical signal) into an analog optical signal. The method preferably includes receiving digital inputs S21 and providing analog optical outputs S22 (e.g., as shown in FIG. 10).

Receiving digital inputs S21 preferably functions to receive a digital representation of an input signal (e.g., a digital signal representative of a value). The inputs are preferably electrical inputs (e.g., represented by electrical characteristics such as voltage and/or current, received via one or more electrical conductors, etc.), but can additionally or alternatively include any other suitable input types. The inputs are preferably serial inputs, but can additionally or alternatively include parallel (e.g., deserialized) and/or serial-parallel (e.g., partially-serialized or -deserialized) inputs, and/or inputs of any other suitable type.

The digital inputs are preferably received by an electronics module. In a first embodiment, the electronics module includes one or more DACs (e.g., includes the electronic DAC array 400 described above), which can function to convert the digital inputs (e.g., serialized binary inputs) into analog (or higher-base digital) electrical signals (e.g., to be provided to a photonics module, such as the optical modulator 300 described above). In a second embodiment, the electronics module includes one or more deserializers (e.g., as described above regarding the system 10), which can function to convert the received serialized digital signals into deserialized digital signals (e.g., to be provided to a photonics module, such as the optical modulator 300 described above).

The digital inputs can additionally or alternatively be received directly by a photonics module (e.g., the optical modulator 300 described above) and/or by any other suitable elements. For example, a parallel unary or binary electrical signal can be received by the segments of an optical modulator (wherein S22 can include using these received signals to directly control modulation of one or more optical signals, such as described above in more detail). However, S21 can additionally or alternatively include receiving any other suitable digital inputs in any other suitable manner.

Providing analog optical outputs S22 preferably functions to convert the received digital signal into an analog optical signal. S22 is preferably performed cooperatively by an electronics module (e.g., including one or more elements such as an electronic DAC array 400 and/or deserializer, etc.) and a photonics module (e.g., optical modulator 300), but can additionally or alternatively be performed by any other suitable elements.

The electronics module preferably converts the digital signal into a plurality of control signals (e.g., electrical control signals), which can be provided to the photonics module to control its operation, but the control signals can additionally or alternatively be generated and/or received in any other suitable manner. In a first embodiment, the electronics module (e.g., electronic DAC array 400) converts the digital signal into analog and/or higher-base digital electrical signals (the control signals) which it provides to the photonics module (e.g., providing each of a plurality of parallel control signals to a different segment 310 of an optical modulator 300), and the photonics module modulates an optical signal based on the control signals. In a second embodiment, the electronics module (e.g., deserializer) converts the digital signal into parallelized digital signals (the control signals) which it provides to the photonics module (e.g., providing each of a plurality of parallel digital electrical signals to a different segment 310 of an optical modulator 300), and the photonics module modulates an optical signal based on the digital electrical signals. In a third embodiment, the photonics module receives the digital signal directly (e.g., without intervention of an electronics module), and modulates an optical signal based on it (e.g., wherein the digital electrical signals are provided as parallel signals); accordingly, in this embodiment, the received digital electrical signals are the control signals. In all such embodiments, the photonics module preferably provides the modulated optical signal as an output.

However, S22 can additionally or alternatively include providing analog optical outputs in any other suitable manner, and/or the method 20 can additionally or alternatively include any other suitable elements performed in any suitable manner. An alternative embodiment preferably implements the some or all of above methods in a computer-readable medium storing computer-readable instructions. The instructions are preferably executed by computer-executable components preferably integrated with a communication routing system. The computer-readable medium may be stored on any suitable computer readable media such as RAMs, ROMs, flash memory, EEPROMs, optical devices (CD or DVD), hard drives, floppy drives, or any suitable device. The computer-executable component is preferably a processor but the instructions may alternatively or additionally be executed by any suitable dedicated hardware device.

Although omitted for conciseness, embodiments of the system and/or method can include every combination and permutation of the various system components and the various method processes, wherein one or more instances of the method and/or processes described herein can be performed asynchronously (e.g., sequentially), concurrently (e.g., in parallel), or in any other suitable order by and/or using one or more instances of the systems, elements, and/or entities described herein.

The FIGURES illustrate the architecture, functionality and operation of possible implementations of systems, methods and computer program products according to preferred embodiments, example configurations, and variations thereof. In this regard, each block in the flowchart or block diagrams may represent a module, segment, step, or portion of code, which comprises one or more executable instructions for implementing the specified logical function(s). It should also be noted that, in some alternative implementations, the functions noted in the block can occur out of the order noted in the FIGURES. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

As a person skilled in the art will recognize from the previous detailed description and from the figures and claims, modifications and changes can be made to the preferred embodiments of the invention without departing from the scope of this invention defined in the following claims.

We claim:

1. A method for digital-to-analog conversion, comprising:
receiving a digital signal representative of a value;
based on the digital signal, generating a plurality of control signals, wherein the plurality of control signals cooperatively define a digital representation representative of the value;
providing a first control signal of the plurality as a first electrical input to a first segment of a first microresonator;
providing a second control signal of the plurality as a second electrical input to a second segment of the first microresonator; and
while providing the first and second control signals, generating an analog optical signal representative of the value, comprising filtering an optical input at the first microresonator based on the first and second electrical inputs.

2. The method of claim 1, further comprising providing a third control signal of the plurality as a third electrical input to a second microresonator, wherein generating the analog optical signal further comprises further filtering the optical input at the second microresonator based on the third electrical input.

3. The method of claim 2, wherein:
the second microresonator comprises a third segment and a fourth segment;
the third electrical input is provided to the third segment;
the method further comprises providing a fourth control signal of the plurality as a fourth electrical input to the fourth segment.

4. The method of claim 1, wherein:
the digital signal comprises a serialized binary signal;
generating the plurality of control signals comprises deserializing the serialized binary signal into the plurality of control signals, wherein each control signal of the plurality is representative of a respective bit of the serialized binary signal.

5. The method of claim 4, wherein:
the first control signal is representative of a most-significant bit of the serialized binary signal;
the second control signal is representative of a second-most-significant bit of the serialized binary signal;
the first segment defines a first modulation response; and
the second segment defines a second modulation response substantially equal to half the first modulation response.

6. The method of claim 1, wherein generating the plurality of control signals comprises:
providing the digital signal to an array of electronic digital-to-analog converters (DACs) comprising a first DAC and a second DAC;
at the first DAC, receiving a first portion of the digital signal and generating the first control signal based on the first portion; and
at the second DAC, receiving a second portion of the digital signal and generating the second control signal based on the second portion.

7. The method of claim 6, wherein:
the digital signal comprises m bits, wherein bit i is the ith most significant bit of the digital signal for any integer $1 \leq i \leq m$;
the first portion comprises a first subset of the digital signal, the first subset consisting of bits 1 through n of the digital signal, wherein n is an integer greater than 2;
the second portion comprises a second subset of the digital signal, the second subset consisting bits n+1 through 2n of the digital signal;
the second segment defines a second modulation response; and
the first segment defines a first modulation response substantially equal to $2^n$ times the second modulation response.

8. The method of claim 7, wherein:
the array of electronic DACs further comprises a third DAC;
generating the plurality of control signals further comprises, at the third DAC, receiving a third subset of the digital signal and generating a third control signal of the plurality based on the third subset, the third subset consisting of bits 2n+1 through 3n of the digital signal;
the method further comprises, while providing the first and second control signals, providing the third control signal to a third segment of the first microresonator;
filtering the optical input at the first microresonator is performed based further on the third electrical input; and
the third segment defines a third modulation response, wherein the second modulation response is substantially equal to $2^n$ times the third modulation response.

9. The method of claim 6, wherein the first DAC comprises a cascode inverter pair.

10. The method of claim 6, wherein the first DAC comprises a charge pump.

11. The method of claim 6, wherein the array of electronic DACs and the first microresonator are collocated on a single substrate.

12. The method of claim 6, wherein:
the array of electronic DACs is defined on a first substrate; and
the first microresonator is defined on a second substrate bonded to the first substrate.

13. The method of claim 1, wherein:
the first microresonator comprises a plurality of p-n semiconductor junctions;
the first segment comprises a first set of junctions of the plurality of p-n semiconductor junctions;
the second segment comprises a second set of junctions of the plurality of p-n semiconductor junctions;
providing the first electrical input to the first segment comprises biasing the first set of junctions; and
providing the second electrical input to the second segment comprises biasing the second set of junctions.

14. The method of claim 13, wherein:
the first segment is electrically coupled to a first electrical contact;
the second segment is electrically coupled to a second electrical contact;
the first microresonator defines a common ground;
biasing the first set of junctions comprises applying the first electrical input between the first electrical contact and the common ground contact; and
biasing the second set of junctions comprises applying the second electrical input between the second electrical contact and the common ground contact.

15. The method of claim 14, wherein:
the first microresonator defines a microdisk structure;
the common ground is defined by a high-doping region located substantially at a center of the microdisk structure.

16. The method of claim 15, wherein the high-doping region is substantially degenerately doped.

17. The method of claim 13, wherein the plurality of p-n semiconductor junctions define at least one of: an interleaved structure, a zig-zag structure, or a vertical junction structure.

18. The method of claim 1, wherein:
the first microresonator defines a microdisk structure;
the first segment is defined over a first angular region of the microdisk having a first central angle; and
the second segment is defined over a second angular region of the microdisk having a second central angle, wherein the first and second angular regions are non-overlapping.

19. The method of claim 18, wherein:
the first control signal is representative of a most-significant portion of the digital signal;
the second control signal is representative of a second-most-significant portion of the digital signal, wherein the significance of the second-most-significant portion is lesser than the significance of the most-significant portion by a factor of n; and
a ratio of the first central angle to the second central angle is substantially equal to n.

20. The method of claim 1, further comprising:
concurrent with providing the first control signal to the first segment, providing the first electrical input to a third segment of a second microresonator optically coupled to the first microresonator; and
concurrent with providing the second control signal to the second segment, providing the second electrical input to a fourth segment of the second microresonator;
wherein generating the optical signal further comprises further filtering the optical input at the second microresonator based on the first and second electrical inputs.

* * * * *